US010049848B2

(12) United States Patent
Smedley et al.

(10) Patent No.: US 10,049,848 B2
(45) Date of Patent: Aug. 14, 2018

(54) PHOTOCATHODE AND METHOD FOR ASSEMBLY

(71) Applicants: Brookhaven Science Associates, LLC, Upton, NY (US); The Regents of the University of California, Oakland, CA (US)

(72) Inventors: John Smedley, Shirley, NY (US); Klaus Attenkofer, Riverhead, NY (US); Susanne Schubert, San Mateo, CA (US); Mengjia Gaowei, Port Jefferson Station, NY (US); John Walsh, Sound Beach, NY (US)

(73) Assignees: Brookhaven Science Associates, LLC, Upton, NY (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 15/179,091

(22) Filed: Jun. 10, 2016

(65) Prior Publication Data
US 2016/0365217 A1 Dec. 15, 2016

Related U.S. Application Data

(60) Provisional application No. 62/175,125, filed on Jun. 12, 2015.

(51) Int. Cl.
*H01L 21/00* (2006.01)
*H01J 9/42* (2006.01)
*C23C 14/34* (2006.01)
*C23C 14/58* (2006.01)
*H01J 9/12* (2006.01)
*C23C 14/14* (2006.01)
*C23C 14/22* (2006.01)

(52) U.S. Cl.
CPC ............... *H01J 9/42* (2013.01); *C23C 14/14* (2013.01); *C23C 14/228* (2013.01); *C23C 14/34* (2013.01); *C23C 14/5846* (2013.01); *H01J 9/12* (2013.01)

(58) Field of Classification Search
CPC .... H01J 9/12; H01J 9/42; C23C 14/14; C23C 14/34; C23C 14/228; C23C 14/5746
USPC .................................... 438/758, 763, 772
See application file for complete search history.

(56) References Cited

PUBLICATIONS

Smedley, J., et al., "Correlating Structure and Function—In Situ X-Ray Analysis of High QE Alkali-Antimonide Photocathodes," Proceedings of IPAC2013, Shanghai, China, Poster Session MOPFI081, pp. 464 (May 13, 2013).
Dolizy, P., "Growth of alkali-antimonide films for photocathodes," Philips tech. Rev., vol. 40, No. 1, pp. 19-32 (1982).
(Continued)

Primary Examiner — Brook Kebede
(74) Attorney, Agent, or Firm — Dorene M. Price

(57) ABSTRACT

Technologies are described for methods for fabricating a film component. The methods may comprise sputtering a first film onto a substrate. The first film may include a semiconductor compound material. The semiconductor compound material may include a semi-metal material and one or more alkali material. The methods may further comprise evaporating a second film onto the first film. The second film may include the one or more alkali materials. The one or more alkali materials may catalyze crystallization of the semiconductor compound material in the first film substantially throughout the first film to form the film component in the first layer.

20 Claims, 3 Drawing Sheets

(56) References Cited

PUBLICATIONS

Smedley, J., "Sputter Growth of Alkali Antimonide Photocathodes: An In Operando Materials Analysis," Proceedings of IPAC2015, Richmond, VA, USA, Poster Session TUPHA003, pp. 1965 (May 5, 2015).

Mamun, M. A. A., et al., "Effect of Sb thickness on the performance of bialkali-antimonide photocathodes," J. Vac. Sci. Technol. A 34, 021509, pp. 021509-1-021509-14 (2016).

PHOTOCATHODE AND METHOD FOR ASSEMBLY

CROSS REFERENCE TO RELATED APPLICATION

This application claims priority to U.S. Provisional Application No. 62/175,125 filed Jun. 12, 2015, the entirety of which is hereby incorporated by reference.

STATEMENT OF GOVERNMENT RIGHTS

The present invention was made with government support under contract numbers DE-SC0012704 and DE-AC02-05CH11231 awarded by the U.S. Department of Energy. The United States government may have certain rights in this invention.

FIELD OF THE INVENTION

This disclosure relates generally to alkali antimonide films, photocathodes, and photodetectors.

BACKGROUND

A photocathode is a metallic or semiconducting cathode that may emit electrons upon the receipt of photons. Alkali antimonide films may be used in photocathodes. Photocathodes may be used in many applications including photodetectors and light sources. A photocathode may be an element in vacuum-tube-based photodetectors, such as discrete-dynode photomultipliers or microchannel-based photomultipliers. A photocathode of a photodetector may dictate the fundamental detector properties including quantum efficiency (QE), wavelength response, dark current behavior, and time response.

SUMMARY

In some examples, methods for fabricating a film component are generally described. The methods may comprise sputtering a first film onto a substrate. The first film may include a semiconductor compound material. The semiconductor compound material may include a semi-metal material and one or more alkali material. The methods may further comprise evaporating a second film onto the first film. The second film may include the one or more alkali materials. The one or more alkali materials may catalyze crystallization of the semiconductor compound material in the first film substantially throughout the first film to form the film component in the first film.

In some examples, apparatus effective to fabricate a film component are described. The apparatus may comprise a sputtering device. The sputtering device may be configured to sputter a film of a semiconductor compound material onto a substrate from a target. The target may include the semiconductor compound material. The semiconductor compound material may include a semi-metal material and one or more alkali materials. The apparatus may further comprise an evaporator. The evaporator may be in operative relationship with the sputtering device. The evaporator may be effective to evaporate one or more alkali materials onto the film of the semiconductor compound material to form a layer of the one or more alkali materials. The layer of the one or more alkali materials may catalyze crystallization of the semiconductor compound material in the film substantially throughout the film of the semiconductor compound material.

In some examples, methods to fabricate a component are generally described. The methods may comprise sputtering a film onto a substrate. The film may include a semiconductor compound material. The semiconductor compound material may include a semi-metal material and one or more alkali materials. The methods may comprise attaching a first material that includes a first alkali on a first end of a first tube. The first tube may be attached to a flange. The methods may comprise attaching a second material that includes a second alkali on a first end of a second tube. The second tube may be attached to the flange. The methods may comprise heating the first tube to evaporate the first material onto the film. The methods may comprise heating the second tube to evaporate the second material onto the film. The methods may comprise depositing the first material from a second end of the first tube onto the film. The methods may comprise depositing the second material from a second end of the second tube onto the film to fabricate the component.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1:
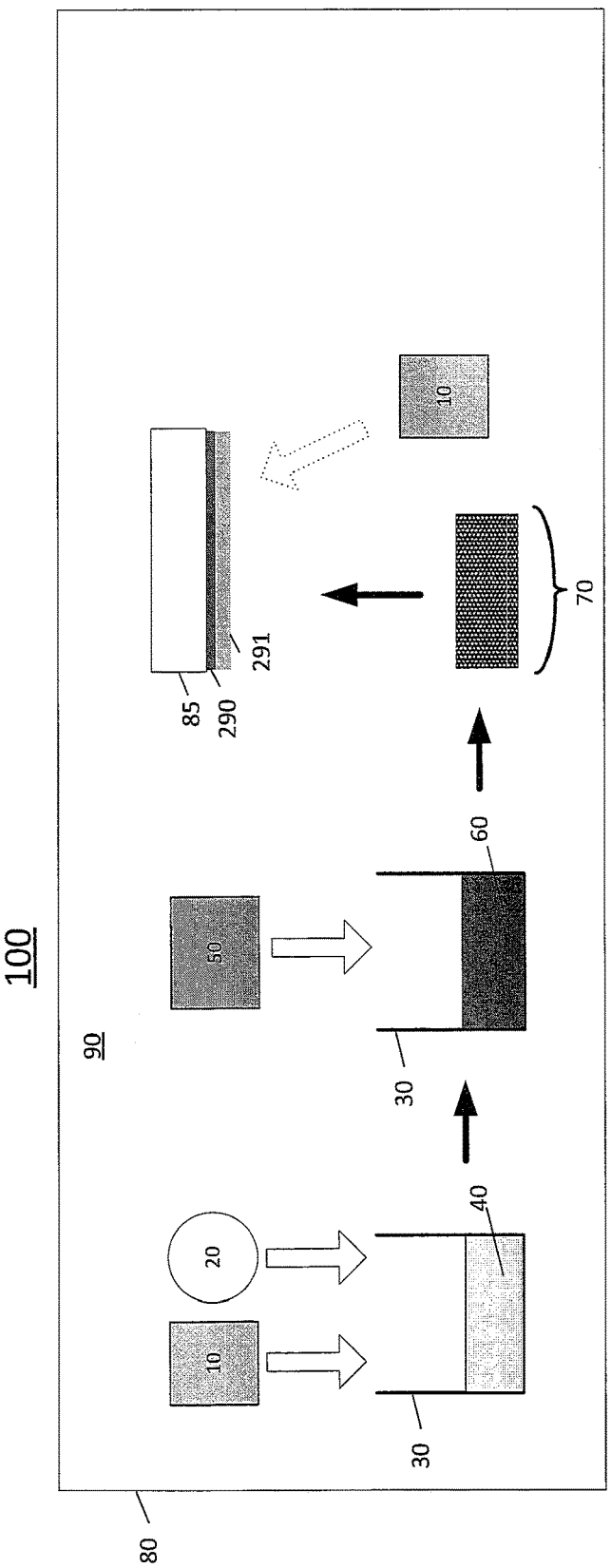
FIG. 1 is a system drawing illustrating a synthesis of a semiconductor compound of polycrystalline $K_2CsSb$.

all arranged according to at least some embodiments described herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

As used herein, any compound, material or substance which is expressly or implicitly disclosed in the specification and/or recited in a claim as belonging to a group or structurally, compositionally and/or functionally related compounds, materials or substances, includes individual representatives of the group and all combinations thereof.

FIG. 1 is a system drawing illustrating a synthesis of a semiconductor compound of polycrystalline $K_2CsSb$, arranged in accordance with at least some embodiments presented herein. System 100 may include a glove box 80 and a chamber 30. Glove box 80 may contain an atmosphere 90. Atmosphere 90 may be argon or other noble gas that has been purified so as to include less than 0.5 ppm of a combination of $O_2$ and $H_2O$. An alkali 10 and an alkali 20 may be mixed together in chamber 30. Alkalis 10 and 20 may be a chemical material from Group 1 of the periodic table. Alkali 10 may be cesium (Cs) and alkali 20 may be potassium (K). Alkali 10 and alkali 20 may be mixed together in chamber 30 to form a liquid alloy composition 40. In the example shown, liquid alloy composition 40 may be $K_2Cs$ when alkali 10 is Cs and alkali 20 is K. Although the atomic radii of K and Cs may differ by ~14%, K and Cs may form a miscible liquid alloy composition 40 at room temperature. Liquid alloy composition 40 may have a freezing point of about −90° C. A semi-metal 50 may be added to alloy composition 40 in chamber 30. Semi-metal 50 may be from Group 1-5 of the periodic table (also referred to as Group Va, the nitrogen group, or the pnictogens). Semi-metal 50 may include arsenic, antimony and bismuth. Semi-metal 50 may be antimony (Sb). Semi-metal 50 may be added to alloy composition 40. Semi-metal 50 may be one molar proportion of semi-metal 50 and may be added in powder or bead form. Semi-metal 50 may be added to alloy composition 40 to form semiconductor compound 60 at room temperature. Semiconductor 60 may have a conductivity between that of an insulator and that of most metals. Semiconductor compound 60 may be further ground to a fine homogenous powder 70 of semiconductor compound 60 using a mortar and pestle. As discussed in more detail below, powder 70 of semiconductor compound 60 may be deposited on a substrate 85 to form a film 290 of semiconductor compound 60. A film 291 of alkali 10 may be deposited on film 290 (i.e., a deposit after sputtering or a post-deposition) to catalyze crystallization (or achieve re-crystallization) of semiconductor compound 60 in film 290.

In an example, semi-metal 50 may be Sb, and may be added to an alloy composition 40 of alkalis Cs and K, to complete a reaction of a semiconductor compound 60 of alkali antimonide ($K_2CsSb$), at room temperature. The reaction to form semiconductor compound 60 of alkali antimonide ($K_2CsSb$) may be spontaneous at room temperature and may occur with a release of some heat. Semiconductor compound 60 of alkali antimonide ($K_2CsSb$) may be a black-colored, highly crystalline powder. Semiconductor compound 60 of alkali antimonide ($K_2CsSb$) may be ground to fine homogenous powder 70 of semiconductor compound 60 comprising alkali antimonide ($K_2CsSb$) using mortar and pestle. Powder 70 may comprise a powder of semiconductor compound 60 of alkali antimonide ($K_2CsSb$) and may be a nanocrystalline powder whose crystallites measure 15-30 nm.

Figure 2:
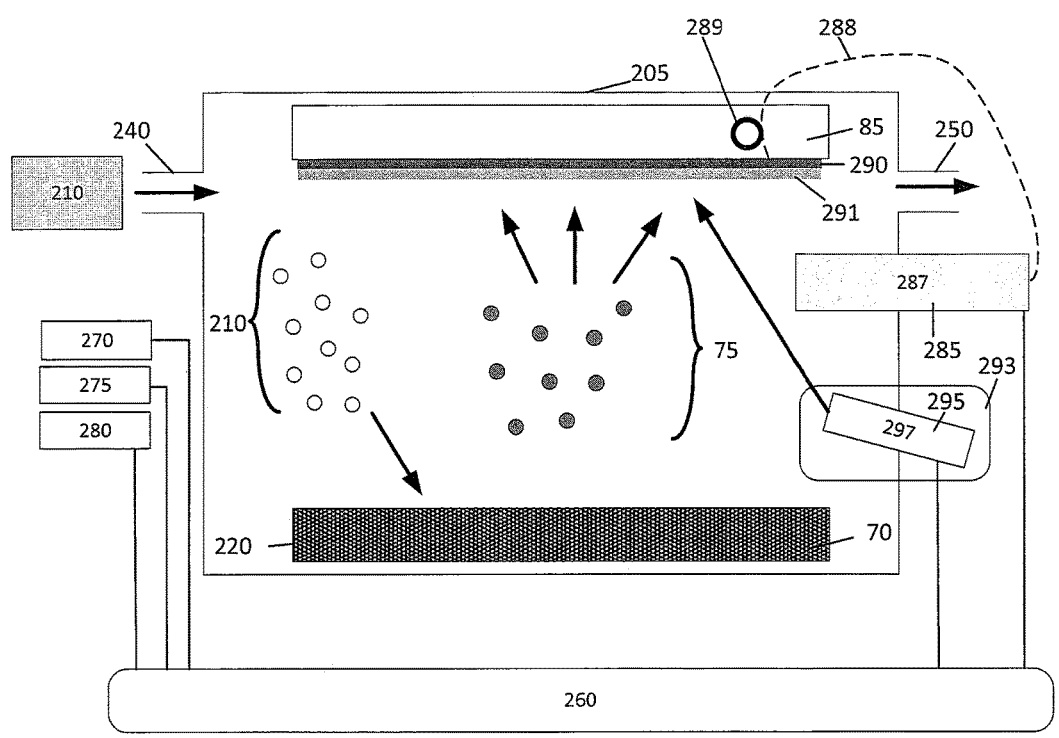
FIG. 2 is a system drawing illustrating a sputtering and evaporating apparatus effective to fabricate a crystallized alkali semi-metallic film photocathode.

FIG. 2 is a system drawing illustrating a sputtering and evaporating apparatus effective to fabricate a crystallized alkali semi-metallic film photocathode, all arranged in accordance with at least some embodiments presented herein. Those components in FIG. 2 that are labeled identically to components of FIG. 1 will not be described again for the purposes of clarity. System 200 may include a chamber 205 with an inlet 240 and an outlet 250, a sputtering gas 210, a controller 260, an X-ray florescence detector 270, an X-ray powder refraction detector 275, an X-ray reflectivity detector 280, a QE measuring device 285, and an evaporator 295. Controller 260 may be in communication with X-ray florescence detector 270, X-ray powder refraction detector 275, X-ray reflectivity detector 280, QE measuring device 285, and evaporator 295. Evaporator 295 may be a device capable of emission of alkali metal upon heating. Evaporator 295 may be a thermal evaporation apparatus, an e-beam evaporator apparatus, or a hot wall evaporation apparatus. Evaporator 295 may be in a separate chamber 293. Chamber 293 may protect and store evaporator 295 during sputtering.

A target 220 may be placed within chamber 205. Target 220 may include powder 70 of semiconductor compound 60 loaded onto a target holder. Powder 70 of semiconductor compound 60 may include alkali antimonide ($K_2CsSb$) and may be pressed and packed in a film to form target 220. A tin or Sb layer may be deposited on top of the film of powder 70 of semiconductor compound 60 when preparing target 220 and subsequently removed when target 220 is to be used.

Substrate 85 may be placed within chamber 205, opposite to target 220. Substrate 85 may be silicon and may be cleaned by dipping in dilute hydrofluoric acid and baked to 500° C. prior to placing within chamber 205 for sputtering. Substrate 85 may be held at 120° C. Chamber 205 may have a pressure of 20 mTorr and may contain an argon atmosphere.

Sputtering gas 210 may be pumped into chamber 205. Sputtering gas 210 may be a noble gas. Sputtering gas 210 may be neon or argon. Sputtering gas 210 may include energetic particles which may bombard target 220. Target 220 may be powered to about 10 watts to form plasma. Sputtering gas 210 may dislodge molecules 75 from target 220. Molecules 75 may include powder 70 comprising semiconductor compound 60. Semiconductor compound 60 may include alkali antimonide ($K_2CsSb$). Molecules 75 dislodged from target 220 may deposit on substrate 85 to form film 290. Film 290 may form at a sputtering rate of 2 angstroms per second (Å/s). Film 290, formed from molecules 75 may include powder 70 comprising semiconductor compound 60. Film 290 may be monitored during sputtering of film 290 by in-situ X-ray florescence detector 270, in-situ X-ray powder refraction detector 275, and/or in-situ QE measuring device 285. X-ray florescence detector 270 may detect stoichiometry for semiconductor compound 60. X-ray powder refraction detector 275 may detect crystallization of semiconductor compound 60. For example, X-ray powder refraction detector 275 may detect that film 290 has a crystalline structure that is crystallized substantially throughout the thickness of film 290.

QE measuring device 285 may include a light source 287, a lead 288, and an anode 289. QE measuring device 285 may determine a ratio between photons incident upon film 290 to photons converted into electrons by film 290. QE measuring device may apply an electric bias between anode 289 coupled by lead 288 to film 290. Anode 289 may be a metallic ring and may be proximate to film 290 and remote from layer 291. Light source 287 may be a single wavelength light source or a wide band light source. Light source 287 may emit light of a wavelength incident to film 290. QE device 285 may measure a photocurrent produced by film 290 in response to incident light from light source 287. QE measuring device 285 may measure photocurrent produced by film 290 between anode 289 and film 290. QE measuring device may determine a QE of film 290 based on the measured photocurrent and the wavelength. In an example, over the course of production of film 290, a QE of about 0.001% up to 50% may be determined. Film 290 may be a photocathode.

After sputtering of film 290, X-ray reflectivity detector 280 may detect a smoothness of the surface of film 290 by measuring the specular and off-specular reflection of the primary beam from film 290. Film 290, formed by sputtering may be smoother than a film formed by another process such as thermal evaporation. Film 290 may be 10 nm to 200 nm in thickness.

Once sputtering is complete and film 290 is formed to a thickness of about 10 nm-200 nm, evaporator 295 may deposit alkali 297 onto film 290 to form layer 291. Alkali 297 may be a chemical material from Group 1 of the periodic table. Alkali 297 may be cesium (Cs). Alkali 297 may include more than one alkali, and may include cesium (Cs) and potassium (K). Evaporator may heat alkali 297 to a temperature of 70° C. to 130° C. Evaporator 295 may deposit alkali 297 to form layer 291 on film 290 at a rate of 0.1 angstroms per second. X-ray florescence detector 270 may detect stoichiometry for semiconductor compound 60 while evaporator 295 is depositing layer 291 of alkali 297 onto film 290. X-ray powder refraction detector 275 may detect crystallization of semiconductor compound 60 while evaporator 295 is depositing layer 291 of alkali 297 to film 290. QE detector 285 may determine QE of film 290 while evaporator 295 is depositing layer 291 of alkali 297 to film 290. In an example where film 290 includes alkali antimonide ($K_2CsSb$), X-ray florescence detector 270 may detect stoichiometry of alkali antimonide ($K_2CsSb$), X-ray powder refraction detector 275 may detect crystallization of alkali antimonide ($K_2CsSb$), and/or QE detector 285 may determine QE of film 290 of alkali antimonide ($K_2CsSb$).

Controller 260 may control evaporator 295 to deposit layer 291 of alkali 297 onto film 290. Controller may control evaporator 295 to deposit layer 291 of alkali 297 until controller 260 determines that the stoichiometry of semiconductor compound 60 is acceptable. Stoichiometry of semiconductor compound 60 may be detected by X-ray florescence detector 270 in communication with controller 260. X-ray florescence detector 270 may incident semiconductor compound 60 with incident X-ray light. Semiconductor compound 60 may emit X-ray light at a lower energy than the incident X-ray light in response. X-ray florescence detector 270 may detect the X-ray light emitted from semiconductor material 60 and identify characteristics of the emitted X-ray light including peak heights to identify elements and a quantity of elements in semiconductor compound 60. Controller 260 may control evaporator 295 to deposit layer 291 of alkali 297 until the crystallization of compound 60 in film 290 has a crystalline structure that is crystallized substantially throughout the thickness of film 290. Crystallization of film 290 may be detected by X-ray powder refraction detector 275 in communication with controller 260. Controller 260 may control evaporator 295 to deposit layer 291 of alkali 297 until a QE value for film 290 is detected with a value greater than a threshold value. A QE value of film 290 may be detected by QE detector 285 connected to controller 260. Controller 260 may control evaporator 295 to deposit film 291 of alkali 297 for a time period of about 30 minutes. Film 291 of alkali 297 deposited by evaporator 295 onto film 290 may catalyze crystallization of semiconductor compound 60. For example, when semiconductor compound 60 is alkali antimonide ($K_2CsSb$) and alkali 297 is Cs, Cs may catalyze crystallization of alkali antimonide ($K_2CsSb$) substantially throughout film 290. Layer 291 may have a thickness of 10 nm to 200 nm. After alkali 297 is deposited by evaporator 295, film 290 may display good photo response with a peak QE of 12% at 350 nm.

Figure 3:
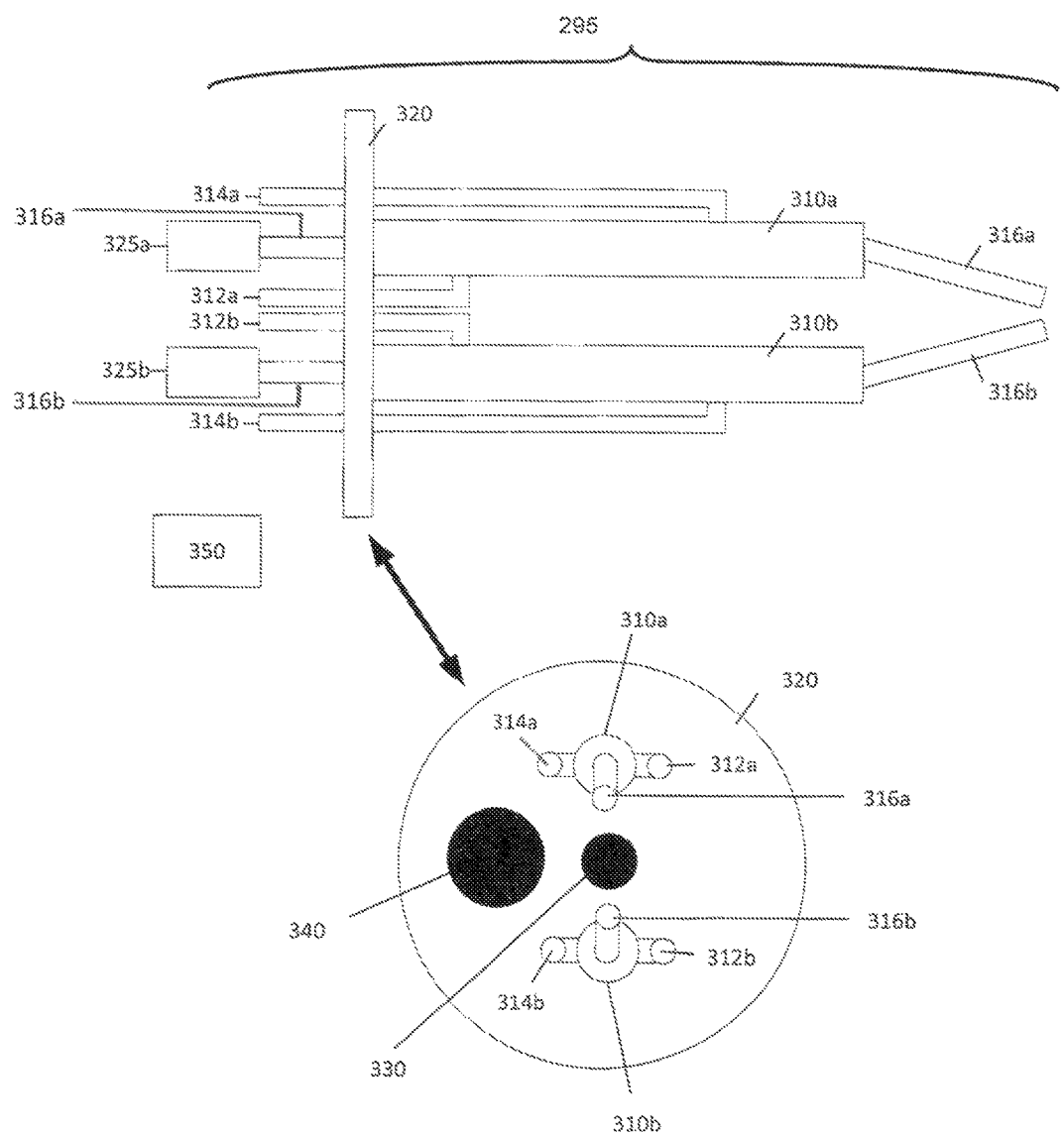
FIG. 3 is a drawing illustrating an evaporating apparatus effective to fabricate a crystallized alkali semi-metallic film photocathode.

FIG. 3 is a drawing illustrating an evaporating apparatus effective to fabricate a crystallized alkali semi-metallic film photocathode, all arranged in accordance with at least some embodiments presented herein. Those components in FIG. 3 that are labeled identically to components of FIGS. 1-2 will not be described again for the purposes of clarity.

Evaporator 295 may include hot air intake tubes 314a, 314b, hot air return tubes 312a, 312b, heating tubes 310a, 310b, alkali output tubes 316a, 316b, and flange 320. Alkali sources 325a, 325b may be attached to evaporator 295. Hot air intake tubes 314a and 314b may supply hot air to heating tubes 310a and 310b respectively. Heating tubes 310a and 310b may surround the outer walls of alkali output tubes 316a and 316b respectively and may heat alkali within alkali outlet tubes 316a, 316b. Alkali sources 325a and 325b may each supply a material to alkali outlet tubes 316a and 316b respectively. A material supplied by alkali sources 325a and 325b may be the same alkali, or may be two different alkalis, one from alkali source 325a and a second from alkali source 325b. Material emitted from evaporator 295 may be 70° C. to 130° C. Material emitted from evaporator 295 may be kept at a constant temperature by an electronic controller 350 which may electronically control the temperature of hot air to hot air intake tubes 314a and 314b.

Flange 320 may define a first hole 330 and a second hole 340. First hole 330 may be a shaft for a shutter. Second hole 340 may allow light to be shown towards the deposition end of evaporator 295.

Among other possible benefits, a system in accordance with the present disclosure may provide photocathodes with high quantum efficiency. Sputter deposition in accordance with the present disclosure of a semiconductor compound may produce a smoother photocathode surface (approaching or substantially atomically smooth, with a roughness on the same order as the characteristic length scale between atoms in the material) than a photocathode produced by thermal evaporation. A system in accordance with the present disclosure may improve the quantum efficiency of the sputtering produced photocathode. A system in accordance with the present disclosure may convert the amorphous alkali antimonide of the semiconductor compound into a cubic crystalline phase and provide excess surface alkalization to achieve photo response. Photocathodes produced by in accordance with the present disclosure may be smoother than those produced by other methods and may display good photo response with high quantum efficiency. In another possible benefit, a system in accordance with the present disclosure may uniformly and quickly coat large areas with the semiconductor compound.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method for fabricating a film component, comprising, sputtering a first film onto a substrate, wherein the first film is formed from molecules dislodged from a target and includes a semiconductor compound material, wherein the target includes the semiconductor compound material, and the semiconductor compound material includes a semi-metal material and one or more alkali materials; and evaporating a second film onto the first film, wherein:
the second film includes the one or more alkali materials; and
the one or more alkali materials catalyze crystallization of the semiconductor compound material in the first film substantially throughout the first film to form the film component in the first film.

2. The method of claim 1, wherein the semi-metal material is antimony.

3. The method of claim 1, further comprising:
measuring a quantum efficiency of the film component;
detecting a crystalline structure of the film component; and
continuing the evaporating of the second film onto the first film until the quantum efficiency of the film component is measured to be greater than a threshold value or the crystalline structure is detected substantially throughout the thickness of the film component.

4. The method of claim 3 wherein the measuring of the quantum efficiency of the film component comprises:
applying an electric bias between an anode of a quantum efficiency measuring device and the film component;
emitting an incident light of a wavelength incident to the film component; and
measuring a photocurrent produced by the film component in response to the incident light, wherein the photocurrent is measured between the anode and the film component, and the quantum efficiency of the film component is determined by the quantum efficiency measuring device based on the measured photocurrent and the wavelength.

5. The method of claim 1, wherein the one or more alkali materials comprise a first alkali material of potassium (K), and a second alkali material of cesium (Cs).

6. The method of claim 1 wherein the semi-metal material is antimony, and wherein the semiconductor compound material comprises $K_2CsSb$.

7. The method of claim 1, wherein the first film has a thickness of about 10 nm to about 200 nm, and the second film has a thickness of about JO nm to about 200 nm.

8. The method of claim 1 wherein the one or more alkali materials comprise cesium (Cs).

9. An apparatus effective to fabricate a film component, the apparatus comprising:
a sputtering device configured to sputter a first film onto a substrate, wherein the first film is formed from molecules dislodged from a target and includes a semiconductor compound material, wherein the target includes the semiconductor compound material and the semiconductor compound material includes a semi-metal material and one or more alkali materials;
an evaporator in operative relationship with the sputtering device, the evaporator effective to evaporate one or more alkali materials onto the first film of the semiconductor compound material to form a layer of the one or more alkali materials and catalyze crystallization of the semiconductor compound material in the first film substantially throughout the first film to form the film component.

10. The apparatus of claim 9, further comprising a quantum efficiency detector in operative relationship with the evaporator, wherein the quantum efficiency detector comprises:
a light source, wherein the light source is effective to generate an incident light of a wavelength incident to the film component;
an anode; and
a lead coupled between the anode and the film component, wherein the quantum efficiency detector is effective to measure a photocurrent response in the film of the semiconductor compound material to the incident light from the light source to determine a quantum efficiency.

11. The apparatus of claim 10, wherein the anode comprises a metallic ring.

12. The apparatus of claim 9, wherein the evaporator is a thermal evaporation apparatus, an e-beam evaporator apparatus, or a hot wall evaporation apparatus.

13. The apparatus of claim 9, further comprising an X-ray powder refraction detector.

14. The apparatus of claim 9 wherein the one or more alkali materials comprise a first alkali material of potassium (K) and a second alkali material of cesium (Cs).

15. The apparatus of claim 14 wherein the semi-metal material is antimony, and where in the semiconductor compound material comprises $K_2CsSb$.

16. The apparatus of claim 9 wherein a thickness of the semiconductor compound material is about 10 nm to about 200 nm and a thickness of the layer of the one or more alkali materials is about 10 nm to about 200 nm.

17. The apparatus of claim 9 wherein a thickness of the semiconductor compound material is in a 1:1 ratio with the thickness of the layer of the one or more alkali materials.

18. A method to fabricate a component, the method comprising:
sputtering a first film onto a substrate, wherein the first film is formed from molecules and includes a semiconductor compound material and the semiconductor compound material includes a semi-metal material and one or more alkali materials;
heating a first end of a first alkali output tube of an evaporator to evaporate a first alkali source;
heating a first end of a second alkali output tube of an evaporator to evaporate a second alkali source, wherein the alkali sources are the same alkali or two different alkalis;
depositing the first alkali source from a second end of the first alkali output tube onto the first film; and
depositing the second alkali source from a second end of the second alkali output tube onto
the first film, wherein the deposited alkali sources form a second film to fabricate the component.

19. The method of claim 18 wherein the first alkali output tube is surrounded by a first heating tube and the second alkali output tube is surrounded by a second heating tube.

20. The method of claim 19, further comprising controlling, by a controller:
a first flow of first hot air through the first heating tube to heat the first alkali output tube;
and a second flow of second hot air through the second heating tube to heat the second alkali output tube.

* * * * *